(12) United States Patent
Hsu

(10) Patent No.: US 6,646,892 B1
(45) Date of Patent: Nov. 11, 2003

(54) FASTENING MECHANISM FOR COVER

(75) Inventor: Hsin-An Hsu, Taipei (TW)

(73) Assignee: First International Computer, Inc. (TW)

(*) Notice: Subject to any disclaimer, the term of this patent is extended or adjusted under 35 U.S.C. 154(b) by 0 days.

(21) Appl. No.: 10/358,328

(22) Filed: Feb. 5, 2003

(51) Int. Cl.[7] .............................. H05K 9/00; H05K 7/12
(52) U.S. Cl. ...................... 361/818; 361/816; 361/800; 174/35 R; 174/35 GC
(58) Field of Search ................................ 361/800, 816, 361/818, 796, 752; 174/35 R, 35 GC, 35 MS; 307/91; 330/68; 331/67; 334/85; 336/84

(56) References Cited

U.S. PATENT DOCUMENTS

| | | | | |
|---|---|---|---|---|
| 4,631,494 A | * | 12/1986 | Gould | 330/286 |
| RE32,664 E | * | 5/1988 | Osepchuk et al. | 219/10.55 D |
| 5,121,296 A | * | 6/1992 | Hsu | 361/395 |
| 5,175,395 A | * | 12/1992 | Moore | 174/35 R |
| 5,419,626 A | * | 5/1995 | Crockett | 312/7.2 |
| 5,436,802 A | * | 7/1995 | Trahan et al. | 361/816 |
| 5,886,879 A | * | 3/1999 | Matuschik | 361/818 |
| 6,178,097 B1 | * | 1/2001 | Haulk, Jr. | 361/816 |
| 6,304,458 B1 | * | 10/2001 | Mendolia | 361/814 |
| 6,469,904 B1 | * | 10/2002 | Vigeant et al. | 361/752 |
| 6,469,912 B1 | * | 10/2002 | Chuang | 361/816 |
| 6,485,595 B1 | * | 11/2002 | Yenni, Jr. et al. | 156/221 |
| 2003/0081399 A1 | * | 5/2003 | Davis et al. | 361/818 |

* cited by examiner

Primary Examiner—David Martin
Assistant Examiner—Dameon E. Levi
(74) Attorney, Agent, or Firm—Bacon & Thomas, PLLC

(57) ABSTRACT

The present invention is to provide a fastening mechanism for a cover of an electronic device enclosed in a housing having a substantially parallelepiped cavity for receiving a peripheral. The fastening mechanism comprises a peripheral flange disposed around an opening of the cavity and having engagement holes and a lock thereon; and a cover shaped to fit on the opening having an upper cover plate, a lower metal plate releasably coupled to the upper cover plate, a plurality of spaced tabs disposed thereon for being snapped into the corresponding engagement holes to fasten the cover onto the flange, and a locking hole so that a turning of the lock will cause a lock member thereof to insert into the locking hole for locking the cover.

7 Claims, 2 Drawing Sheets

FASTENING MECHANISM FOR COVER

FIELD OF THE INVENTION

The present invention relates to fastening mechanisms and more particularly to an improved fastening mechanism for the cover of an electronic device.

BACKGROUND OF THE INVENTION

A conventional fastening mechanism for housing of an electronic device is used to fasten the housing to a peripheral flange on the electronic device. In detail, a plurality of tabs are formed on a periphery of the housing and several holes are formed on the housing. A plurality of slots are formed around the flange for matingly receiving the tabs so as to fasten the housing to the flange. Also, several threaded holes mated with the holes are formed on the flange. Hence, several fasteners (e.g., screws) can be driven through the holes and the threaded holes to secure the housing to the flange.

However, the prior art suffered from several disadvantages. For example, as stated above, the housing and the flange are fastened together by driving the screws through the holes and the threaded holes and inserting the tabs into the slots. Hence, for disengaging the housing from the flange a screwdriver is needed to unfasten the screws one by one from the holes and the threaded holes prior to removing the tabs one by one from the slots. It is understood that a tedious, complex detaching process is inevitable for removing the housing from the flange prior to replacing a peripheral placed in the housing. It is quite inconvenient and troublesome.

In addition, an unauthorized person may use a screwdriver to unfasten the screws for detaching, replacing, or manipulating the peripheral in the housing. Hence, the prior art fastening mechanism is not safe. Hence, a need for improvement exists.

SUMMARY OF THE INVENTION

A primary object of the present invention is to provide a fastening mechanism for a cover of an electronic device enclosed in a housing, the housing having a substantially parallelepiped cavity for receiving a peripheral. The fastening mechanism comprises a peripheral flange releasably fastened to the cover. By utilizing this, an access and/or replacement of the peripheral is facilitated by unfastening and opening the cover.

The above and other objects, features and advantages of the present invention will become apparent from the following detailed description taken with the accompanying drawings.

DETAILED DESCRIPTION OF THE PREFERRED EMBODIMENTS

Figure 1:
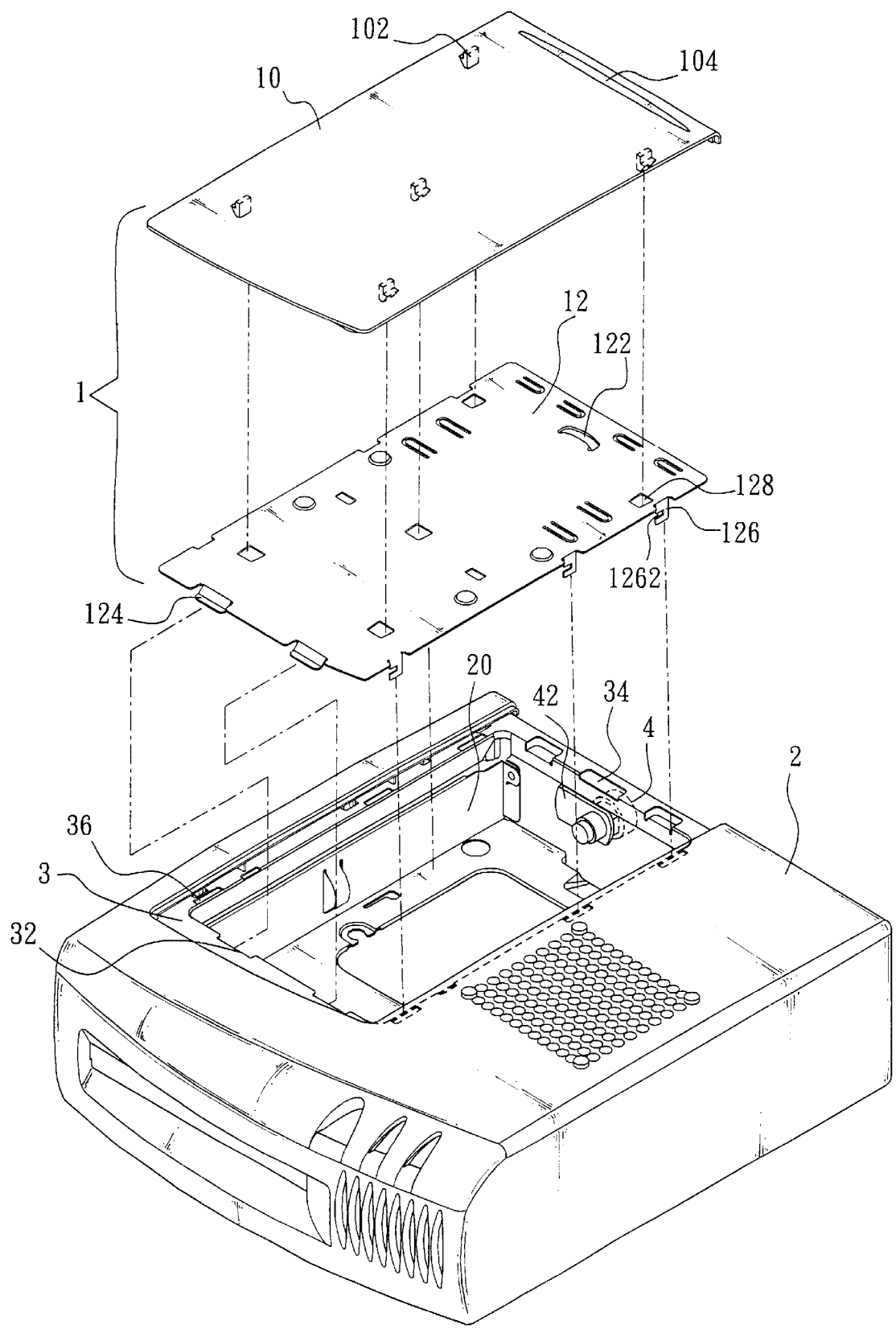
FIG. 1 is an exploded view of a cover incorporating a fastening mechanism adapted to fasten to a housing of an electronic device according to the invention.
Figure 2:
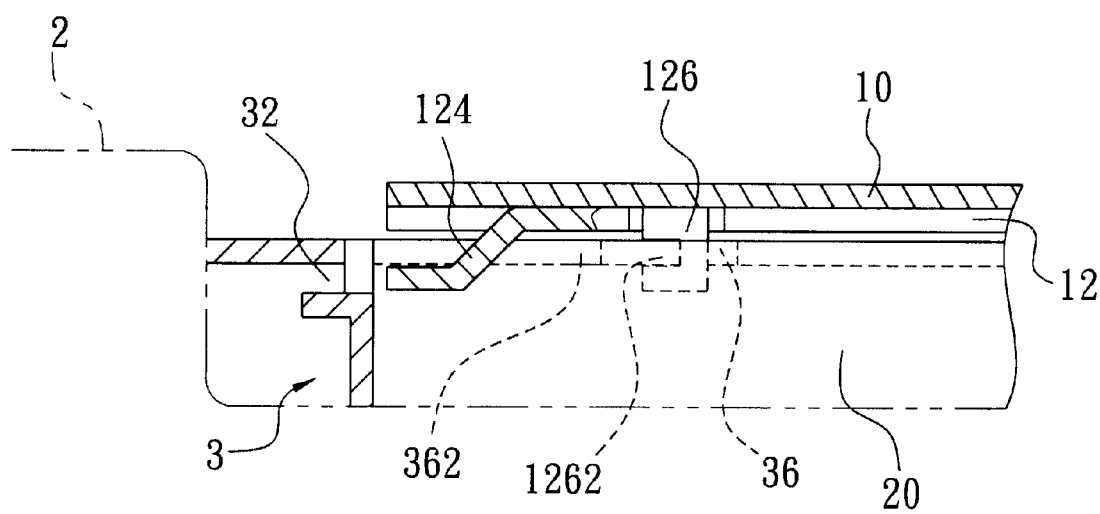
FIG. 2 is a cross-sectional view where the cover is being fastened to the housing.
Figure 3:
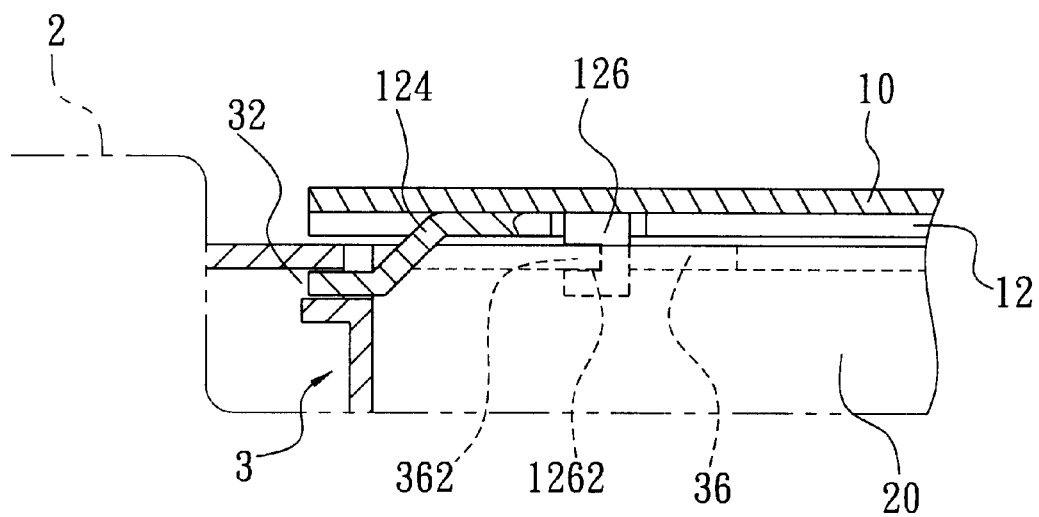
FIG. 3 is a view similar to FIG. 2 where the cover has been fastened to the housing.

Referring to FIGS. 2 and 3 in conjunction with FIG. 1, there is shown a fastening mechanism for cover in accordance with the invention. The fastening mechanism can be used to fasten a cover on a housing of an electronic device. In detail, a substantially parallelepiped cavity 20 is formed on a top surface of a housing 2. A peripheral flange 3 is formed at an opening of the cavity 20. A rectangular cover 1 is fitted on the flange 3. The cover 1 comprises two tabs 124 at a front side engaged with two engagement holes 32 at the flange 3 for fastening the cover 1 to the flange 3. When a peripheral (not shown), such as a hard disk in the embodiment or any of other suitable devices in the other embodiments of the invention, is placed in the cavity 20, the cover 1 can be placed on the flange 3. As a result, dust and other foreign objects cannot fall into the cavity 20 and electromagnetic waves generated by the peripheral can be prevented from transmitting to the outside. Also, a user can easily detach the cover 1 to remove the peripheral.

In the invention, the cover 1 is shaped to conform to the opening of the cavity 20 and comprises an upper cover plate 10 and a lower metal plate 12 releasably coupled to the upper cover plate 10. In detail, the upper cover plate 10 comprises a plurality of latched members 102 at underside facing the metal plate 12 and an elongated indentation 104 adjacent and parallel to a rear side at top. The metal plate 12 is served to prevent electromagnetic waves generated by the peripheral from transmitting to the outside and comprises a locking hole 122 adjacent a rear side and disposed corresponding to the indentation 104, a plurality of (two are shown) spaced tabs 124 at a front side opposite to the locking hole 122, a plurality of downward pegs 126 at either side, and a plurality of holes 128 disposed corresponding to the latched members 102. As such, the upper cover plate 10 and the metal plate 12 can be fastened together by inserting the latched members 102 into the holes 128.

The flange 3 comprises a plurality of (two are shown) engagement holes 32 at a front side disposed corresponding to the tabs 124, a through hole 34 at a rear side disposed corresponding to the locking hole 122, and a plurality of positioning slots 36 at either side disposed corresponding to the downward pegs 126. The downward pegs 126 can slide in the positioning slots 36 for securing the cover 1 onto the flange 3. Moreover, the downward peg 126 comprises a recess 1262 toward the tab 124. The positioning slot 36 comprises a positioning member 362 adjacent the engagement hole 32 and extended therefrom. As such, the positioning members 362 are snapped into the recesses 1262 when the downward pegs 126 are slid along the positioning slots 36. As an end, the cover 1 is prevented from disengaging the opening of the cavity 20.

A lock 4 is formed at the rear side of the flange 3 adjacent the through hole 34. An outer end of the lock 4 is projected from the housing 2. The lock 4 comprises a lock member 42 at an inner end. The lock member 42 projects from the through hole 34 when the lock 4 is turned to a closed position. To the contrary, the lock member 42 retracts into the housing 2 when the lock 4 is turned reverse to an open position.

Referring to FIGS. 2 and 3 in conjunction with FIG. 1, the cover 1 is placed on the opening of the cavity 20 prior to fastening the cover 1 at the same position. In detail, insert the downward pegs 126 into the positioning slots 36. Next, slide the downward pegs 126 along the positioning slots 36 toward the engagement holes 32 until the tabs 124 are snapped into the engagement holes 32 for fastening. As a result, the cover 1 is secured onto the flange 3 on the housing 2. In other words, the cover 1 is prevented from disengaging the housing 2. Moreover, dust and other foreign objects cannot fall into the cavity 20 for damaging the peripheral stored therein.

The lock member 42 projects from the through hole 34 into the locking hole 122 when the lock 4 is turned to a closed position. As an end, the housing 2 is locked by the lock member 42. Also, the downward pegs 126 are inhibited from sliding in the positioning slots 36, thereby preventing the cover 1 from disengaging the housing 2. In addition, the peripheral is stably received in the cavity 20 as the cover 1 is fastened to the flange 3.

To the contrary, the lock member 42 retracts into the housing 2 when the lock 4 is turned reverse to an open position. Next, the user can press the indentation 104 and slide the cover 1. Next, the downward pegs 126 are slid along the positioning slots 36 to cause the tabs 124 to clear from the engagement holes 32. At this time, the user can remove the cover 1 from the housing 2 for accessing the peripheral. It is designed that only a person having the key of the lock 4 can open the cover 1 for accessing the peripheral. In other words, an unauthorized person (e.g., one not having the key of the lock 4) will not be able to open the cover 1. Hence, the peripheral is well protected.

In brief, the user has to detach the flange from the housing for replacing a component in the housing as experienced in the prior art fastening mechanism for housing of electronic device. In contrast, the user can easily replace a component in the cavity 20 by opening the cover 1 as taught by the fastening mechanism in accordance with the invention. This is particularly useful since the peripheral is seldom replaced. Hence, the housing 2 is disassembled only when a need for replacing an internal component exists. By utilizing the invention, it is possible of opening the cover 1 for removing the peripheral from the cavity 20 for replacement. As a result, time spent for disassembling the housing 2 and tedious procedure of the housing 2 disassembly are both eliminated.

While the invention has been described by means of specific embodiments, numerous modifications and variations could be made thereto by those skilled in the art without departing from the scope and spirit of the invention set forth in the claims.

What is claimed is:

1. A fastening mechanism for a cover of an electronic device enclosed in a housing, the housing having a substantially parallelepiped cavity for receiving a peripheral, the fastening mechanism comprising:

a peripheral flange at an opening of the cavity and comprising a plurality of engagement holes and a lock at a rear side, the lock having a lock member; and a cover shaped to fit on the opening of the cavity, the cover comprising an upper cover plate, a lower metal plate releasably coupled to the upper cover plate, the metal plate being capable of preventing electromagnetic waves generated by the peripheral from transmitting to the outside, a plurality of spaced tabs at a front side disposed corresponding to the engagement holes, the tabs being snapped into the engagement holes for fastening the cover onto the flange, and a locking hole adjacent the lock so that a turning of the lock will cause the lock member to insert into the locking hole for locking the cover.

2. The fastening mechanism of claim 1, wherein the metal plate comprises a plurality of downward pegs at either side and the flange further comprises a plurality of positioning slots at either side disposed corresponding to the downward pegs, the downward pegs being capable of inserting into and sliding in the positioning slots.

3. The fastening mechanism of claim 1, wherein the cover plate comprises an upper elongated indentation adjacent and parallel to a rear side.

4. The fastening mechanism of claim 1, wherein the peripheral is a hard disk.

5. The fastening mechanism of claim 1, wherein the tabs are disposed at a front side of the metal plate corresponding to the engagement holes.

6. The fastening mechanism of claim 1, wherein the cover plate further comprises a plurality of latched members at underside facing the metal plate, the metal plate further comprises a plurality of holes disposed corresponding to the latched members, and the cover plate and the metal plate are fastened together as the latched members are inserted into the holes.

7. The fastening mechanism of claim 2, wherein the downward peg comprises a recess toward the tab and the positioning slot comprises a positioning member adjacent the engagement hole and extended therefrom.

* * * * *